United States Patent

Singvall

(10) Patent No.: US 6,742,158 B2
(45) Date of Patent: May 25, 2004

(54) LOW COMPLEXITY CONVOLUTIONAL DECODER

(75) Inventor: Jakob Singvall, Lund (SE)

(73) Assignee: Telefonaktiebolaget LM Ericsson(publ), Stockholm (SE)

( * ) Notice: Subject to any disclaimer, the term of this patent is extended or adjusted under 35 U.S.C. 154(b) by 229 days.

(21) Appl. No.: 09/870,731

(22) Filed: May 30, 2001

(65) Prior Publication Data

US 2002/0184594 A1 Dec. 5, 2002

(51) Int. Cl.⁷ .................. H03M 13/00; H03M 13/03
(52) U.S. Cl. ...................... 714/786; 714/781
(58) Field of Search .................. 714/786, 793; 11/781, 791

(56) References Cited

U.S. PATENT DOCUMENTS

| | | | | |
|---|---|---|---|---|
| 5,402,447 A | * | 3/1995 | Roney, IV | 375/340 |
| 5,467,297 A | | 11/1995 | Zook | 364/746.1 |
| 6,014,411 A | * | 1/2000 | Wang | 375/259 |

FOREIGN PATENT DOCUMENTS

EP   1 059775 A1   12/2000

OTHER PUBLICATIONS

Arnold M. Michelson and David F. Freeman; Bit–Error Rate Performance of the (63, 57) Hamming Code and a Severely Punctured Convolution Code with Maximum Likelihood Decoding; 1994 IEEE; pp. 1012–1016.

Chip Fleming; A Tutorial on Convolutional Coding with Viterbi Decoding; 15 Pages.

Riku Pirhonen, et al., "TDMA Based Packet Data System Standard and Deployment", Vehicular Technology Conference, IEEE, May 1999, pp. 743–747.

European Patent Office Standard Search Report, Jan. 15, 2002.

* cited by examiner

*Primary Examiner*—Albert Decady
*Assistant Examiner*—Joseph D. Torres
(74) *Attorney, Agent, or Firm*—Jenkens & Gilchrist, P.C.

(57) ABSTRACT

Method and apparatus for decoding a convolutionally encoded sequence of bits encoded by an encoder with given generator polynomial. The encoded sequence of bits is decoded by a decoder which comprises an inverted given generator polynomial. The decoder is particularly designed for encoders having a code rate 1, including encoders utilized in EDGE/EGPRS communications systems. The decoder is less complex than Viterbi decoders, and is faster and requires less memory than Viterbi decoders.

17 Claims, 2 Drawing Sheets

LOW COMPLEXITY CONVOLUTIONAL DECODER

BACKGROUND OF THE INVENTION

1. Field of the Invention

The present invention relates generally to the field of convolutional coding; and, more particularly, to a method and apparatus for decoding convolutionally encoded data.

2. Description of the Prior Art

Convolutional codes are used to correct bit errors that occur when digital bits are communicated between a transmitter and a receiver. The transmitter and receiver may be physically connected, or they may interact wirelessly; for example, in a wireless digital communications system.

A typical convolutional encoder introduces dependency and adds redundancy to the encoded sequence. The amount of redundancy introduced by the encoder is measured as n/k, where k is the length of the sequence input to the encoder and n is the length of the sequence output from the encoder in a given encoder cycle. The code rate C is defined as c=k/n, and is usually in the range of $0 < c \leq 1$.

FIG. 1 illustrates a convolutional encoder 10 with a code rate c=½ provided in a transmitter 11. More specifically, FIG. 1 illustrates a G7G4-encoder used in a GSM (Global System for Mobile Communication) system with generator polynomial $(1+D+D^2+D^3+D^6 1+D^2+D^3+D^5+D^6)$. As shown in FIG. 1, and as known to those skilled in the art; the encoder 10 is typically implemented as a shift register together with associated combinatorial logic. The shift register is composed of a chain of six delay elements (i.e., flip-flops) 12; and the combinatorial logic is composed of a plurality of suitably positioned modulo-2 adders 14, typically implemented as exclusive-or gates. The number of delay elements in the encoder that feed the combinatorial logic that produces the output sequence is defined as the "constraint length" of the code. A sequence input to the encoder at input 16 is encoded by the encoder to produce encoded output sequences at 18.

In order to add some extra redundancy, so-called "terminating codes" are often used. These start and end in pre-defined states, often the all zero state. This is accomplished by starting the encoding in the all zero state and adding zeros at the end of the sequence that is input to the encoder, as many as the size of the constraint length of the code.

EDGE (Enhanced Data rates for Global Evolution) is an interface mode which has recently been developed for GSM, as well as for CPRS (General Packet Radio Service) systems. GPRS is a packet switched system that uses the same physical carrier structure as the GSM cellular communications system. EDGE's principal features include new modulation and coding schemes which increase data capacity and speed in the air interface. The packet switched data mode with EDGE modulation is called EGPRS (Enhanced GPRS).

In EDGE/EGPRS systems, convolutional codes having different code rates are used as compared to those used in GSM. Among these is a code with a code rate c=1. FIG. 2 illustrates a convolutional encoder 20 in a transmitter 21 that is used in EDGE/EGPRS systems. More particularly, FIG. 2 illustrates a G4-encoder with generator polynomial $(1+D^2+D^3+D^5+D^6)$, code rate c=1. As shown, the encoder 20 is implemented as a shift register with six delay elements 22, and combinatorial logic comprised of a plurality of modulo-two adders 24. A sequence input to the encoder at 26 is encoded by the encoder to produce an encoded output sequence at 28.

At the receiver, a convolutional decoder attempts to reconstruct the original sequence that was input to the convolutional encoder at the transmitter (e.g., the sequence input at 26 in FIG. 2) by utilizing knowledge of the code used by the encoder at the transmitter, and the redundancy in the sequence received by the receiver. To every bit in the received, estimated sequence, there are so-called soft values attached. These soft values are calculated earlier in the receiver, for example, in the equalizer; and are used during the decoding to provide a measure of how good the estimation of the bit is.

Using a code with a code rate c=1 reduces the possibilities to correct bit errors, because there is no redundancy in the received bit sequence except for the starting and ending state.

The common way to decode a convolutionally encoded sequence is to use a Viterbi decoder (see R. Johannesson and K. S. Zigangirov, "Fundamentals of convolutional coding", IEEE Press series on Digital & Mobile Communication, IEEE Press, 1999). The Viterbi decoder investigates all possible sent sequences and compares them with the received sequence. The most probable sequence is calculated, with respect to the soft values.

The Viterbi decoder uses a large amount of memory and requires that many calculations be carried out. In order to reduce the size of the memory, a Viterbi decoder with back-search limit is often used. A Viterbi decoder with back-search limit investigates only a part of all possible sent sequences when making a bit decision.

The current procedures for decoding a convolutionally encoded sequence suffer from a variety of shortcomings. Initially, as indicated above, the Viterbi decoder uses a large amount of memory and requires that a great many calculations be carried out. This results in an increase in power consumption such that in a mobile telephone, for example, the talk and stand-by time of the telephone is decreased.

Using a Viterbi decoder with back-search limit will reduce memory requirements; however, it will not reduce the number of calculations that are required to be carried out. Furthermore, performance is negatively affected by introducing the back-search limit, especially when convolutional codes with code rate 1 are used, since the starting and ending states are not connected in the investigated trellis.

SUMMARY OF THE INVENTION

The present invention provides a method and apparatus for decoding convolutionally encoded data which enables simplification of the overall decoding process as compared with conventional decoding procedures. More particularly, a method for decoding a convolutionally encoded sequence of bits encoded by an encoder with given generator polynomial according to the present invention comprises the step of using an inverted given generator polynomial as a decoder.

According to a presently preferred embodiment, the decoding method of the present invention decodes a convolutionally encoded sequence of bits encoded by an encoder with generator polynomial $(1+D^2+D^3+D^5+D^6)$, code rate 1, and uses a decoder with inverted generator polynomial $1/(1+D^2+D^3+D^5+D^6)$. Preferably, the decoder is implemented as a shift register with feedback, together with appropriate combinatorial logic.

The convolutional decoder of the present invention provides substantially the same results as a Viterbi decoder with back-search limit, except for the last n bits, if n is the back-search limit of the Viterbi decoder; inasmuch as there will be no redundancy in the encoded frame except for the start and end state. The frame error rate can be reduced, however, by checking the end state of the shift register. Specifically, when a terminating code is used, the encoder will send tailbits; and the shift register of the decoder should end up in a predefined state. If it does not, the frame has been erroneously decoded; and according to a preferred embodiment of the invention, a redecoding procedure is performed until the end state of the shift register is in the predefined state or until a predefined number of decodings are carried out.

The decoding method and apparatus of the present invention provides several advantages as compared with a Viterbi decoder, including a Viterbi decoder with back-search limit. Among such advantages include a lower complexity (since only a few of all possible paths in the trelllis are calculated), and a smaller memory size and higher performance than a Viterbi decoder with back-search limit. The method according to the present invention also provides greater flexiblity than conventional decoders in that with the present invention, the performance of the decoder can be increased as desired by increasing its complexity.

According to one alternative embodiment of the invention, the required number of calculations can be reduced by splitting the frame into two halves which are separately decoded. According to another alternative embodiment, the time required for a complete decoding can be reduced by using several shift registers operating in parallel with different input sequences.

Yet further advantages and specific details of the present invention will become apparent hereinafter in conjunction with the following detailed description of presently preferred embodiments.

DETAILED DESCRIPTION OF PRESENTLY PREFERRED EMBODIMENTS OF THE INVENTION

Figure 3:
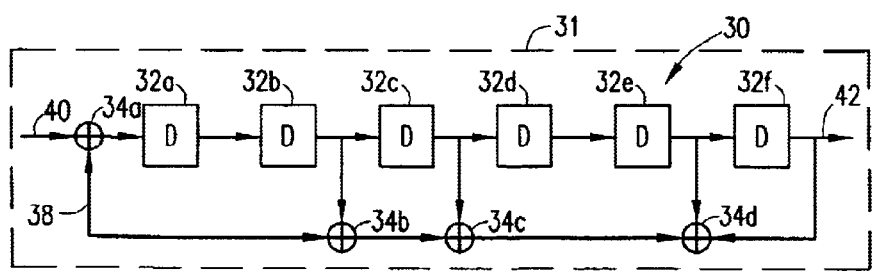
FIG. 3 schematically illustrates a convolutional decoder according to a presently preferred embodiment of the present invention for decoding the sequence encoded by the encoder of FIG. 2.

FIG. 3 schematically illustrates a convolutional decoder according to a presently preferred embodiment of the invention for decoding a sequence coded with code rate 1; and in particular, for decoding the sequence encoded by the G4-encoder used in EDGE/EGPRS systems with generator polynomial $(1+D^2+D^3+D^5+D^6)$, code rate 1. In accordance with the present invention, decoding is accomplished by using the inverted generator polynomial $1/(1+D^2+D^3+D^5+D^6)$ as a decoder. As shown in FIG. 3, the decoder according to the present invention is preferably implemented as a shift register with feedback.

Specifically, in FIG. 3, the convolutional decoder is generally designated by reference number 30 and is provided in a receiver 31. The decoder comprises a shift register composed of six delay elements implemented by flip-flops 32a–32f, together with associated combinatorial logic composed of a plurality of modulo-two adders implemented by exclusive-or gates 34a–34d. As shown in FIG. 3, the output of the last flip-flop 32f in the chain is fed back to the input of the first flip-flop 32a via feedback path 38. The outputs of flip-flops 32b, 32c and 32e are all combined with the output of flip-flop 32f via modulo-two adders 34b, 34c and 34d, respectively. The feedback path 38 feeds the combined signal back to the input of the first flip-flop 32a where it is combined with the signal input into the decoder on line 40 by modulo-two adder 34a.

With the decoder 30 illustrated in FIG. 3, the output of the decoder on line 42 will be an estimate of the originally coded sequence; and will give the same result as a Viterbi decoder with back-search limit, except for the last n bits, if n is the back-search limit of the Viterbi decoder. This is because there is no redundancy in the encoded frame except for the start and end state.

In order to reduce the frame error rate, the end state of the shift register 30 can be checked. Specifically, when a terminating code is used, the encoder will send tailbits; and the shift register 30 should end up in a predefined state; and if it does not, it is certain that the frame has been erroneously decoded. If the frame has been erroneously decoded, the bit sequence is redecoded according to the present invention by changing the input sequence input to the decoder on line 40. Preferably, the input sequence is changed by inverting the bit with the smallest soft value. The redecoding may start at the position of the changed bit to reduce the number of calculations. If the end state of the shift register after this redecoding is still not the predefined state, the bit sequence is again redecoded by again changing the input sequence, preferably by inverting the second smallest soft value. The redecoding process is continued by inverting some combination of the smallest soft values until a decoding operation ends up with the shift register in the predefined end state or until a predetermined maximum number of decodings have been carried out.

Figure 1:
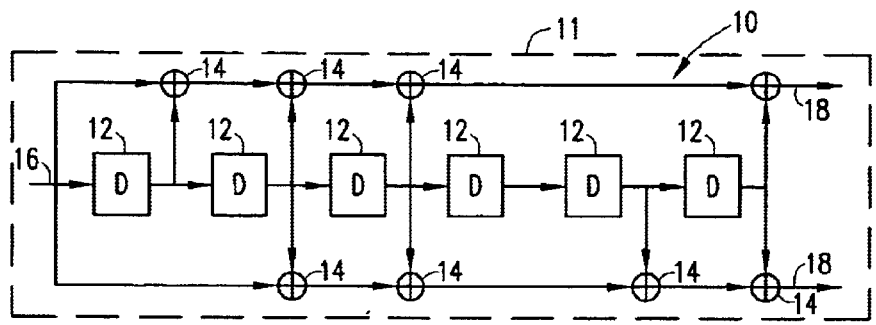
FIG. 1 schematically illustrates a known convolutional encoder used in GSM systems.
Figure 2:
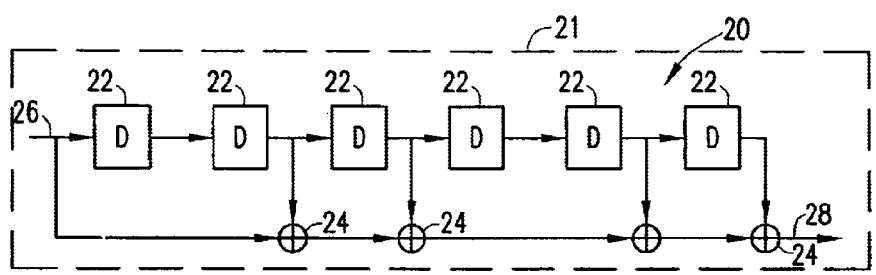
FIG. 2 schematically illustrates a known convolutional encoder used in EDGE/EGPRS systems.
Figure 4:
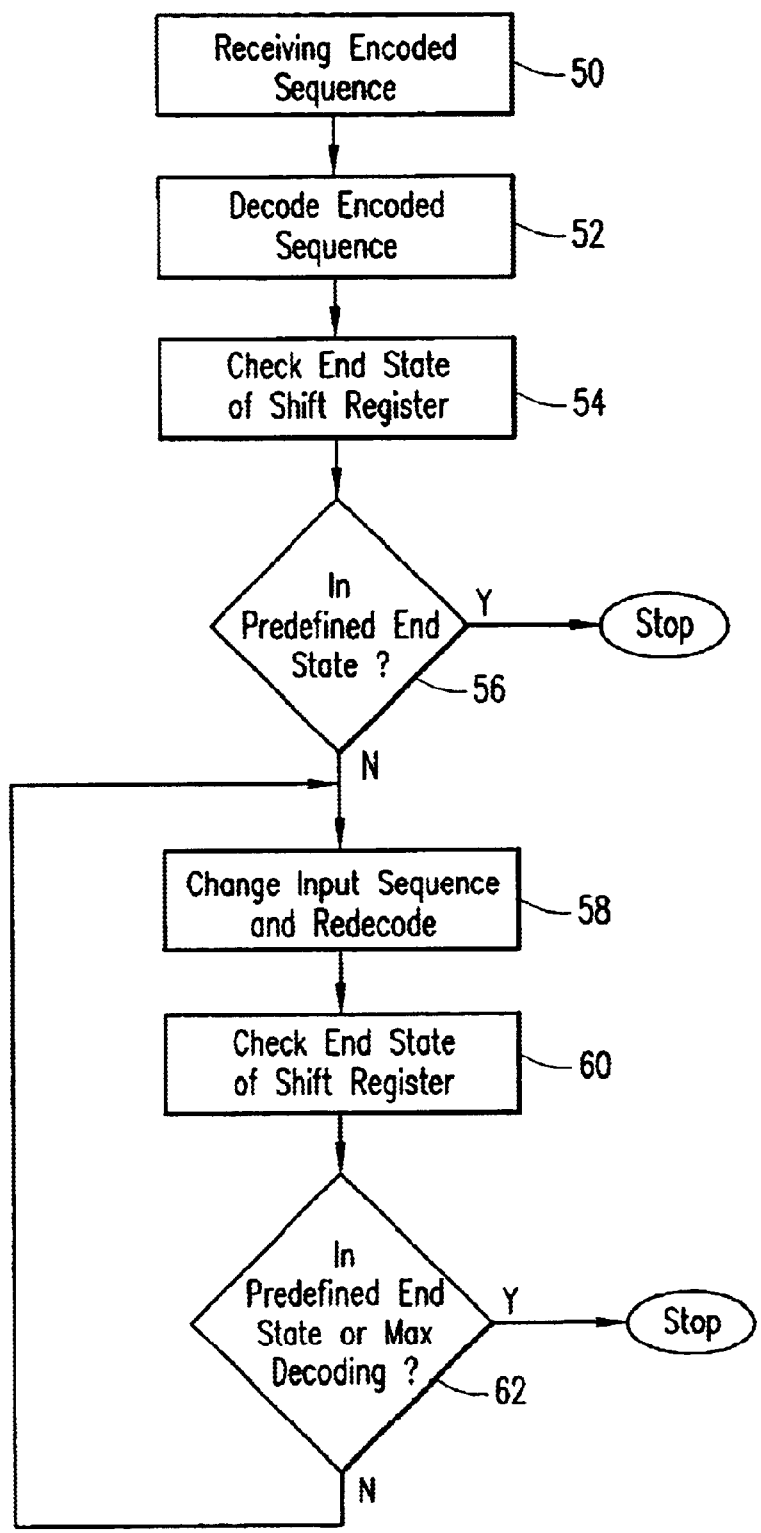
FIG. 4 is a flow chart illustrating a decoding method according to a presently preferred embodiment of the present invention.

FIG. 4 is a flow chart which illustrates steps of a method for decoding convolutionally encoded data according to a presently preferred embodiment of the invention. As shown, a convolutionally encoded sequence is sent by a transmitter over a communication channel and is received at the receiver (step 50). In the presently preferred embodiment, the transmitter and receiver are incorporated in an EDGE/EGPRS communications system, and the sequence has been encoded in the transmitter utilizing the G4-encoder illustrated in FIG. 2 with code rate 1. The received coded sequence is then decoded using the inverted generator polynomial of FIG. 3, implemented as a shift register with feedback, as a decoder (step 52). If a terminating code is used, the end state of the shift register 30 is checked (step 54), and if the shift register ends up in the predefined end state (Y output of step 56), the process stops. If the shift register does not end up in the predefined end state (N output of step 56), it is certain that the frame is erroneously decoded; and the bit sequence is then redecoded after changing the input sequence (step 58). As indicated above, this is preferably done by inverting the bit with the smallest soft value.

The end state of the shift register is again checked (step 60), and if it is now at the predefined end state (Y output of step 62), the process stops. If it is still not at the predefined end state, the bit sequence is again redecoded after again changing the input sequence (N output of step 62), preferably by inverting the second smallest soft value for the next redecoding or by changing some combination of the smallest soft values for subsequent redecodings. The redecoding process is continued until a decoding ends up in the pre-defined end state or until a maximum number of decodings are carried out (Y output of step 62).

In order to reduce the number of calculations, it is possible to split the frame into two halves; which are separately decoded while starting at the edges of the frame. In this embodiment also, the ending states are used as the error check, and both decodings should end up in the same state. If a redecoding becomes necessary, only the half with the changed bit has to be redecoded.

It is also possible to reduce the time required for a complete decoding to be carried out by providing several shift registers which operate in parallel with different input sequences. The output from the shift register which ends up in the predefined end state and with the least changed input sequence is used as the estimate of the uncoded sequence.

The decoder of the present invention is significantly less complex than a Viterbi decoder inasmuch as only a few of all possible paths in the trellis need to be calculated and no path metrics or summation of the soft values are required to be carried out. The logic part is also much smaller.

With the present invention, only a relatively small-sized memory is required, and the process is quite fast inasmuch as only relatively few calculations are required to be carried out. The invention also provides a higher degree of performance than Viterbi decoders with back-search limit inasmuch as the invention is able to correct errors in the whole frame, not only the last n bits as in the Viterbi decoder with back-search limit.

The decoder of the present invention is also able to flag when a frame is erroneously decoded; i.e., when no decoding ends up in the predefined end state. In addition, the decoder is highly flexible in that the performance can be increased if the user is willing to allow some increase in complexity; i.e., by increasing the number of bits to be inverted.

It should be emphasized that the term "comprises/comprising" when used in this specification is taken to specify the presence of stated features, integers, steps or components; but does not preclude the presence or addition of one or more other features, integers, steps, components or groups thereof.

It should also be understood that although presently preferred embodiments of the invention have been described herein, the invention can be varied in many ways without departing therefrom. For example, although the present invention has been described in connection with decoding a sequence encoded by the G4-encoder used in EDGE/EGPRS systems with code rate 1, it is not intended to so limit the invention inasmuch as the invention can also be used to decode data encoded by other encoders. Because the present invention can be varied in many ways, it should be recognized that the present invention should be limited only insofar as is required by the scope of the following claims.

What is claimed is:

1. A method of decoding a convolutionally-encoded sequence of bits encoded by an encoder with a given generator polynomial, the method comprising:
   receiving the convolutionally-encoded sequence of bits;
   decoding the convolutionally-encoded sequence of bits using an inverted given generator polynomial, the step of decoding comprising:
      feeding back an output sequence of bits; and
      combining the fed-back output sequence of bits with the received convolutionally-encoded sequence of bits;
   determining whether a pre-defined end state has been reached; and
   responsive to a determination that the pre-defined end state has not been reached:
      changing an input sequence; and
      repeating the decoding step.

2. The method according to claim 1, wherein the convolutionally-encoded sequence of bits is encoded with code rate 1.

3. The method of claim 1, wherein the inverted given generator polynomial is $1/(1+D^2+D^3+D^5+D^6)$.

4. The method according to claim 1, wherein:
   the inverted generator polynomial is implemented as a shift register with combinational logic; and
   the convolutionally-encoded sequence of bits includes a terminating code.

5. The method according to claim 4, the method comprising:
   providing a plurality of shift registers operating in parallel; and
   wherein an output from the plurality of shift registers is used as an estimate of an uncoded sequence of bits, the output being in the predefined end state and having a least-changed input sequence of bits.

6. The method according to claim 1, wherein the step of changing the input sequence comprises inverting a bit in the input sequence, the bit having a smallest soft value.

7. The method according to claim 1, wherein:
   the steps of changing the input sequence and repeating the decoding step are repeated after inverting a combination of bits having the smallest soft values; and
   the repeating of the decoding step occurs until an end state is in the predefined state or a predetermined number of decodings have occurred.

8. The method according to claim 1, the method further comprising:
   splitting the input sequence into two halves; and
   separately decoding each of the two halves.

9. The method according to claim 8, wherein, if the decoding is performed a second time, only a half of the two halves in which a bit has been changed is decoded the second time the decoding is performed.

10. A decoder for decoding a convolutionally-encoded sequence of bits encoded by an encoder with a given generator polynomial, the decoder comprising:
    means for receiving the convolutionally-encoded sequence of bits;
    means for decoding the convolutionally-encoded sequence of bits using an inverted given generator polynomial, the means for decoding comprising:
       means for feeding back an output sequence of bits; and
       means for combining the fed-back output sequence of bits with the received convolutionally-encoded sequence of bits;
    means for determining whether a pre-defined end state has been reached; and
    means for changing an input sequence and repeating the decoding step responsive to a determination that the pre-defined end state has not been reached.

11. The decoder according to claim 10, wherein the decoder is incorporated in an EDGE/EGPRS communications system.

12. The decoder according to claim 10, wherein the convolutionally-encoded sequence of bits is encoded with code rate 1.

13. The decoder of claim 10, wherein the inverted given generator polynomial is $1/(1+D^2+D^3+D^5+D^6)$.

14. The decoder according to claim 10, wherein the convolutionally-encoded sequence of bits includes a terminating code.

15. The decoder according to claim 14, the decoder further comprising:

means for splitting the input sequence into two halves; and means for separately decoding each of the two halves.

16. The decoder according to claim 15, wherein, if the decoding is performed a second time, only a half of the two halves in which a bit has been changed is decoded the second time the decoding is performed.

17. The decoder according to claim 10, wherein the means for changing the input sequence comprises means for inverting a bit in the input sequence, the bit having a smallest soft value.

* * * * *